(12) United States Patent
Rokos

(10) Patent No.: US 6,549,055 B2
(45) Date of Patent: Apr. 15, 2003

(54) METHOD AND APPARATUS FOR GENERATING AN INPUT SIGNAL FOR A PARAMETER SENSITIVE CIRCUIT

(75) Inventor: George Hedley Storm Rokos, Little Sampford (GB)

(73) Assignee: C-Mac Quartz Crystals Limited, Edinburgh Way (GB)

( * ) Notice: Subject to any disclaimer, the term of this patent is extended or adjusted under 35 U.S.C. 154(b) by 0 days.

(21) Appl. No.: 09/990,533

(22) Filed: Nov. 21, 2001

(65) Prior Publication Data

US 2002/0060597 A1 May 23, 2002

(30) Foreign Application Priority Data

Nov. 21, 2000 (GB) .......................................... 0028366.3

(51) Int. Cl.[7] .............................. G06G 7/12; H01L 35/00
(52) U.S. Cl. ........................ 327/317; 327/317; 327/513
(58) Field of Search ................................ 327/317, 362, 327/513, 552

(56) References Cited

U.S. PATENT DOCUMENTS

| 4,270,098 A | | 5/1981 | Bowman ..................... 331/96 |
| 4,560,959 A | | 12/1985 | Rokos et al. ............... 331/176 |
| 4,633,197 A | | 12/1986 | Vanderspool, II .......... 332/16 T |
| 4,786,970 A | * | 11/1988 | Moore ....................... 327/513 |
| 4,843,255 A | * | 6/1989 | Stuebing ..................... 327/513 |
| 5,557,241 A | | 9/1996 | Burke ......................... 331/14 |
| 5,691,671 A | | 11/1997 | Bushman ..................... 331/158 |
| 5,731,742 A | | 5/1998 | Wojwoda et al. ............. 331/44 |
| 5,798,854 A | | 8/1998 | Blauvelt et al. ............ 359/161 |
| 6,218,886 B1 | * | 4/2001 | Balistreri et al. ........... 327/362 |

FOREIGN PATENT DOCUMENTS

| EP | 0613252 A | 8/1998 | ............ H03L/1/02 |
| EP | 0998022 A | 5/2000 | ............ H03B/5/32 |
| GB | 2038125 A | 7/1980 | ............ H03L/1/02 |
| GB | 2172457 A | 9/1986 | ............ H03G/3/00 |
| GB | 2286301 A | 8/1995 | ............ H03J/7/02 |
| GB | 2288087 A | 10/1995 | ............ H03C/3/22 |
| GB | 2341020 A | 3/2000 | ............ H03B/5/32 |
| JP | 08116214 A | 5/1996 | ............ H03B/5/32 |

* cited by examiner

Primary Examiner—Toan Tran
(74) Attorney, Agent, or Firm—Arnall Golden Gregory LLP

(57) ABSTRACT

Apparatus (1) for generating a control signal for a tunable circuit (3) sensitive to temperature receives an input control signal and predistorts it in a distortion circuit (4), so that the output (5) of the tunable circuit (3) will be substantially corrected for non-linearities in the tunable circuit (3). The distortion circuit (4) includes a linear non-distortion circuit element (9), which may be a linear temperature compensation element, and one or more non-linear distortion circuit elements (12, 13, 14), each of which distort the input control signal according to a different function. The outputs of the distortion circuit elements are passed to variable gain elements (17, 18, 19, 20) to produce weighted components. The weighted linear and non-linear components are then combined in a combination circuit element (8) to provide a predistorted control signal to the tunable circuit (3).

26 Claims, 5 Drawing Sheets

METHOD AND APPARATUS FOR GENERATING AN INPUT SIGNAL FOR A PARAMETER SENSITIVE CIRCUIT

FIELD OF THE INVENTION

This invention relates to a method and apparatus for generating an input signal for a parameter sensitive circuit, particularly, to a method and apparatus for predistorting an input signal for a tunable circuit, such as an oscillator circuit or a filter circuit, so that an output of the tunable circuit is substantially corrected for non-linearities in the tuning of the tunable circuit.

BACKGROUND OF THE INVENTION

Many frequency controlled tunable circuits, such as oscillator or filter circuits have non-linear frequency output characteristics, that is, the frequency output vs. control (current or potential) characteristic is not linear. When good linearity is desired, oscillator designers typically select component types and apply resonant effects to achieve a characteristic that meets the requirement as nearly as possible. Sometimes, system designs need to be modified, when it is not possible or practical to achieve the desired linearity. Even when linearity is achievable, component and dimension tolerances can require either that components are individually selected following device tests, or that physical adjustments are made during the manufacturing process. This obviously increases production costs.

In some applications, absolute control rate can be important. Temperature dependencies can limit the final system performance, or require that an otherwise low-power system be placed in a temperature controlled environment, such as an oven.

It will be appreciated that a constant frequency tuning rate can be important for systems, such as temperature compensated crystal oscillators, to avoid degradation of frequency accuracy when the oscillator is tuned away from the conditions under which it was compensated. Such tuning may be necessary to correct for, for example, ageing of the quartz crystal, or to match the operating environment. One situation where this is particularly relevant is in retiming circuits where a local crystal oscillator tracks an intermittent input clock with a frequency that is allowed to deviate from a nominal value. To ensure a rapid recovery from loss of input clock signal, the local crystal oscillator is required to continue oscillating at the last observed frequency for extended periods.

BRIEF SUMMARY OF THE INVENTION

The present invention therefore seeks to provide a method and apparatus, which overcomes, or at least reduces the above-mentioned problems of the prior art, for generating an input signal to a parameter sensitive circuit so that an output of the tunable circuit is substantially corrected for tuning non-linearities in the tunable circuit.

Accordingly, in a first aspect, the invention provides a method of generating a control signal for a parameter sensitive circuit, the method comprising the steps of receiving a first input control signal, receiving a second input signal indicative of the parameter to which the circuit is sensitive, generating a third intermediate signal from the first and second input signals, generating at least a fourth intermediate signal having a non-linear dependence on at least one of the first and third signals, and generating an output control signal for the parameter sensitive circuit, by combining at predetermined levels at least the fourth intermediate signal and one of the first, second and third signals such that the output control signal is dependent on both the first and second input signals, whose sensitivity to changes in one of the input signals is dependent on the level of the other input signal.

Preferably, at least the fourth intermediate signal comprises a polynomial function of at least one of the first and third signal on which it is dependent.

The third signal preferably comprises the sum of a constant, a constant multiple of the first input signal, and a constant multiple of the product of the first and the second input signals. The first and second input signals are preferably at least partly independent of each other, that is, neither of the signals can be determined solely from the other.

In a preferred embodiment, the first input signal is dependent on the same parameter as the second input signal. The output control signal preferably comprises the sum of signals that are polynomial functions of the third signal, but may alternatively comprise the sum of signals that are polynomial functions of the third signal and a temperature-dependent signal. In one embodiment, there is further included the step of providing at least one predetermined gain control signal for controlling the gain of any of the signals utilised to generate the output control signal, so that the sensitivity of the parameter sensitive circuit to changes in the first input signal is substantially independent of both the parameter and the level of the first input signal.

In a preferred embodiment, the parameter is temperature, but may be any other environmental parameter, such as pressure or acceleration.

In a second aspect, the invention provides a circuit for generating a control signal according to the method described above, and, in a further aspect, provides an apparatus comprising a parameter sensitive circuit and such a circuit for generating a control signal.

In a preferred embodiment, the parameter sensitive circuit comprises a tunable circuit and the output control signal of the circuit compensates for parameter sensitive variations of tuning components that are used to tune the tunable circuit.

Preferably, the output control signal of the circuit comprises the sum of signals that are polynomial functions of the third signal and a temperature-dependent signal, said temperature-dependent signal being suitable for compensating for variations of built-in potential of the tuning components.

The coefficients of the polynomial functions are preferably adjustable to compensate for non-linear tuning of the tunable circuit.

Preferably, the second input signal is dependent solely on temperature, and is suitable for compensating for residual temperature dependence of the tuning sensitivity of the tunable circuit. The first input signal preferably includes a temperature dependent component suitable for compensating for a temperature dependence of a nominal resonance frequency of the tunable circuit.

Preferably, the first input signal is generated as a sum of a signal that is dependent only on temperature, and another signal that is independent of temperature, the first input signal being suitable for setting a nominal resonance frequency of the tunable circuit to a frequency that is dependent on this temperature-independent signal, and with a predetermined temperature dependence. The temperature-dependence of the tuning rate preferably provides compensation for temperature sensitivity of other components of a phase-lock-loop incorporating the tunable circuit.

At least one component of the tunable circuit may be oscillatory and the tunable circuit preferably incorporates at least an electro-acoustic resonator.

In a further aspect, the invention may provide an integrated circuit incorporating an apparatus for generating a control signal for a tunable circuit as described above. Preferably, the integrated circuit further incorporates a memory for storing at least one of temperature dependent and non-linear parameters. The integrated circuit preferably further incorporates at least part of the tunable circuit.

BRIEF DESCRIPTION OF THE DRAWINGS

One embodiment of the invention will now be more fully described, by way of example, with reference to the drawings, of which.

DETAILED DESCRIPTION OF THE DRAWINGS

Figure 1:
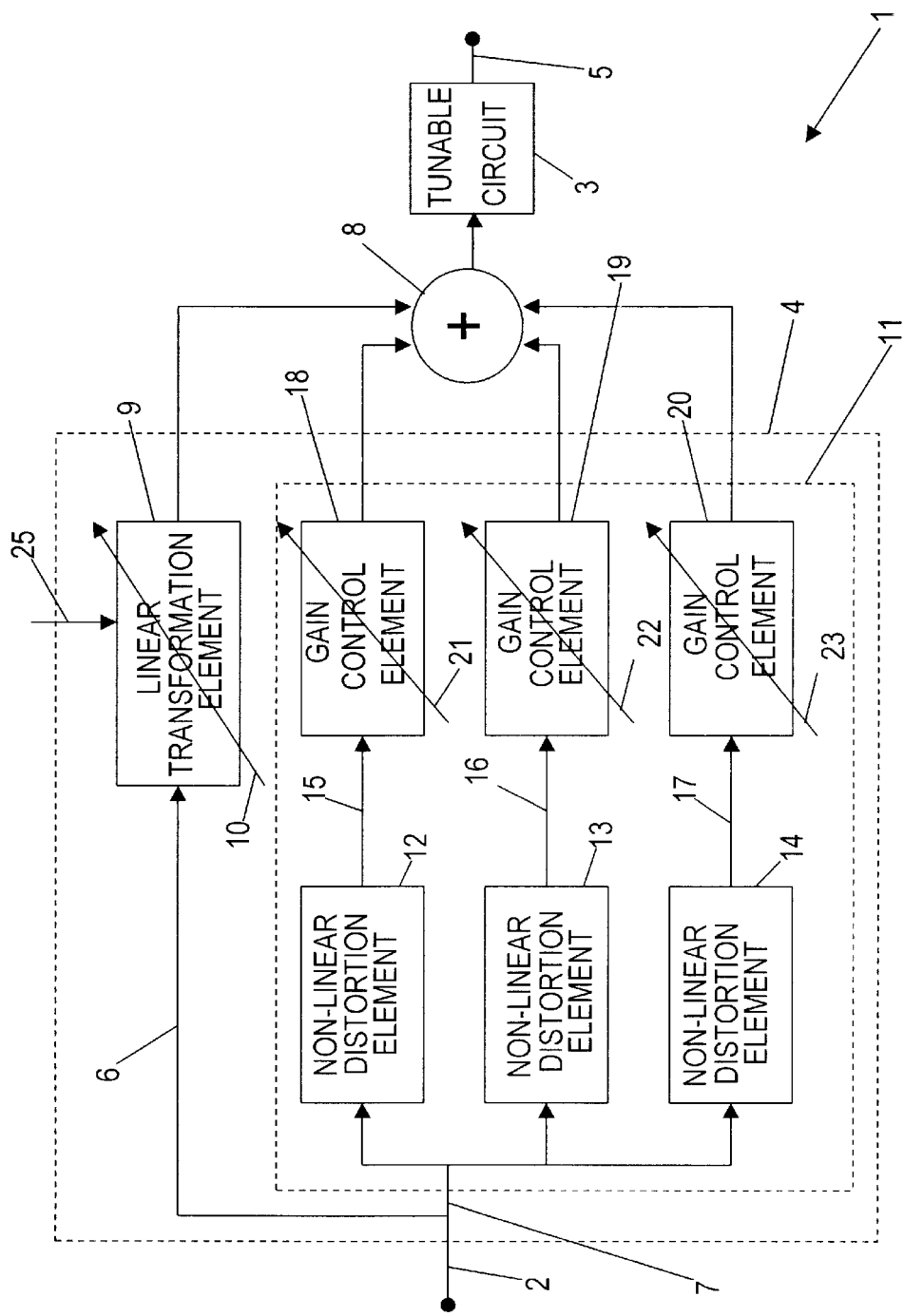
FIG. 1 shows a schematic circuit diagram of a tunable circuit system according to a first embodiment of the present invention.

Thus, as shown in FIG. 1, a tunable circuit system 1 receives a frequency control input signal $I_{FC}$ at an input terminal 2. The frequency control input signal is used to control the frequency of a tunable circuit 3, which can be, for example, an oscillator circuit or a filter circuit. The tunable circuit generally includes a tuning control element, such as a variable capacitance diode, and a frequency stabilising element, which may be a piezo-electric device or a dielectric resonator.

As mentioned above, most such tunable circuits have non-linear frequency output characteristics with respect to the frequency control input signal. Therefore, there is provided a predistortion circuit 4 to predistort the frequency control input signal $I_{FC}$ in such a way as to substantially compensate for the non-linear frequency output characteristics so that a frequency control output signal at output terminal 5 exhibits substantially linear characteristics with respect to the frequency control input signal at input terminal 2.

The predistortion circuit 4 receives the frequency control input signal $I_{FC}$ and passes it via paths 6 and 7 to a combining circuit element 8. In a first of the paths 6, the frequency control input signal $I_{FC}$ is passed via a linear transformation circuit element 9 to the combining circuit element 8. The linear transformation circuit element 9 transforms the frequency control input signal $I_{FC}$ in a non-distorted, linear fashion to provide a linear component of the frequency control input signal to the combining circuit element 8. The linear component can be multiplied by a constant and, in this embodiment, is multiplied by a gain and temperature coefficient to provide linear temperature compensation to the frequency control input signal. A temperature coefficient is provided at temperature coefficient input 25 to the linear transformation circuit element 9. The temperature coefficient can be adjusted, of course, if necessary, according to circumstances, but will be, in general, constant for any particular system and can be pre-programmed into the linear transformation circuit element 9. A gain control input 10 provides a gain coefficient to adjust the gain of the linear transformation circuit element 9.

The second of the paths 7 leads to a distortion circuit 11, where the frequency control input signal $I_{FC}$ is passed to a number of separate non-linear distortion elements 12, 13 and 14, of which three are shown. Each of the non-linear distortion elements 12, 13 and 14 transforms the frequency control input signal $I_{FC}$ from path 7 to provide a non-linear component at respective outputs 15, 16 and 17, which are coupled to the combining circuit element 8 via respective gain control elements 18, 19 and 20. Each of the gain control elements 18, 19 and 20 has a control input 21, 22 and 23, respectively, to weight the non-linear components and the weighting is adjustable or programmable, as required. In this embodiment, the first non-linear distortion element 12 utilises a square power law function to generate a square power component of the frequency control input signal. It will be appreciated, of course, that other power law functions, such as a cubic power law can be used additionally or alternatively to the square power law function.

The second non-linear distortion element 13 utilises a Chebyshev-like power series function to generate a Chebyshev series component of the frequency control input signal. The Chebyshev-like power series function can take the form of:

$T_1(x)=1$ $T_2(x)=2x^2-1$ $T_N(x)=2x.T_{N-1}(x)-T_{N-2}(x)$ where $T_N(x)$ is the Chebyshev function N for an input signal x.

It will be appreciated, of course, that other power law functions, such as a Taylor series can be used additionally or alternatively to the Chebyshev function.

Finally, the third non-linear distortion element 14, as shown in this embodiment, utilises a logarithmic function to generate a logarithmic component of the frequency control input signal. It will be appreciated, of course, that other functions, such as an exponential can be used additionally or alternatively to the logarithmic function.

The non-linear distortion elements 12, 13 and 14 can be of any desired configuration. For example, a set of analogue multipliers, such as so-called Gilbert cells, could be used.

Figure 2:
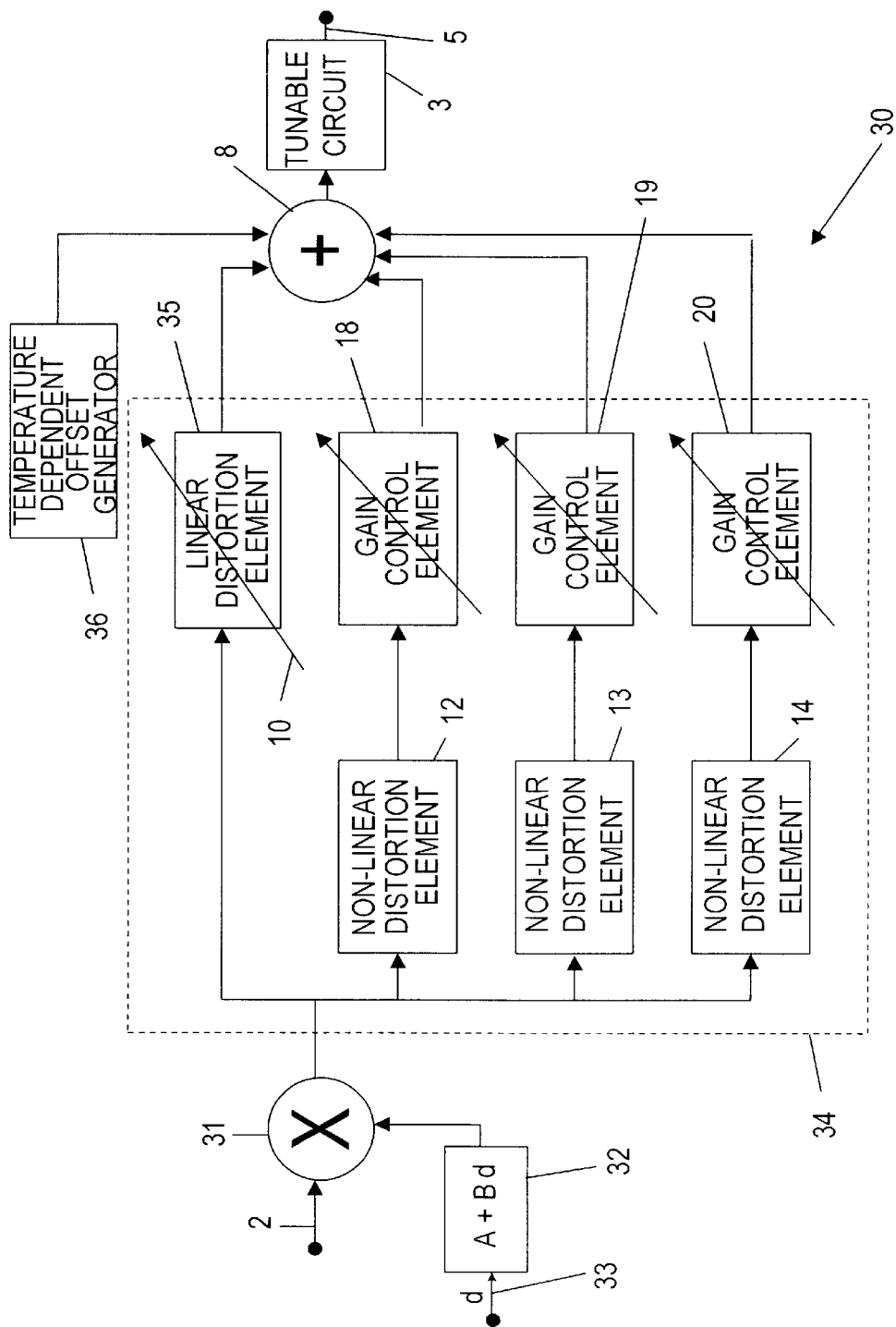
FIG. 2 shows a schematic circuit diagram of a tunable circuit system according to a second embodiment of the present invention.

A second embodiment of a tunable circuit system 30 is shown in FIG. 2, where the same elements as in the first embodiment of FIG. 1 are shown with the same reference numerals. In this embodiment, a multiplier 31 receives the frequency control input signal $I_{FC}$ from input terminal 2. The multiplier 31 also receives a temperature dependent signal $S_\theta$ from a variable temperature function generator 32 and multiplies the frequency control input signal $I_{FC}$ by the temperature dependent signal $S_\theta$. The variable temperature function generator 32 generates the temperature dependent signal $S_\theta$ from a signal indicating the temperature θ, which signal is provided at a temperature input terminal 33. The temperature dependent signal $S_\theta$ can be generated using a function such as:

$S_\theta = A + B\theta$ where A and B are user defined constants.

The output of the multiplier 31 is coupled to a predistortion circuit 34, similar to predistortion circuit 4 described above, except that predistortion circuit 34 is made to be temperature independent. In other respects, the predistortion circuit 34 operates in the same way as the predistortion circuit 4 of FIG. 1, except that, because it is temperature independent, the linear transformation circuit element 35 does not provide linear temperature compensation, but only a gain controlled from the gain control input 10. As before, the outputs of the gain control elements 18, 19, 20 and 34 are coupled to the combining circuit element 8. In this embodiment, however, a temperature dependent offset is also provided to the combining circuit element 8 from a temperature dependent offset generator 36.

Figure 3:
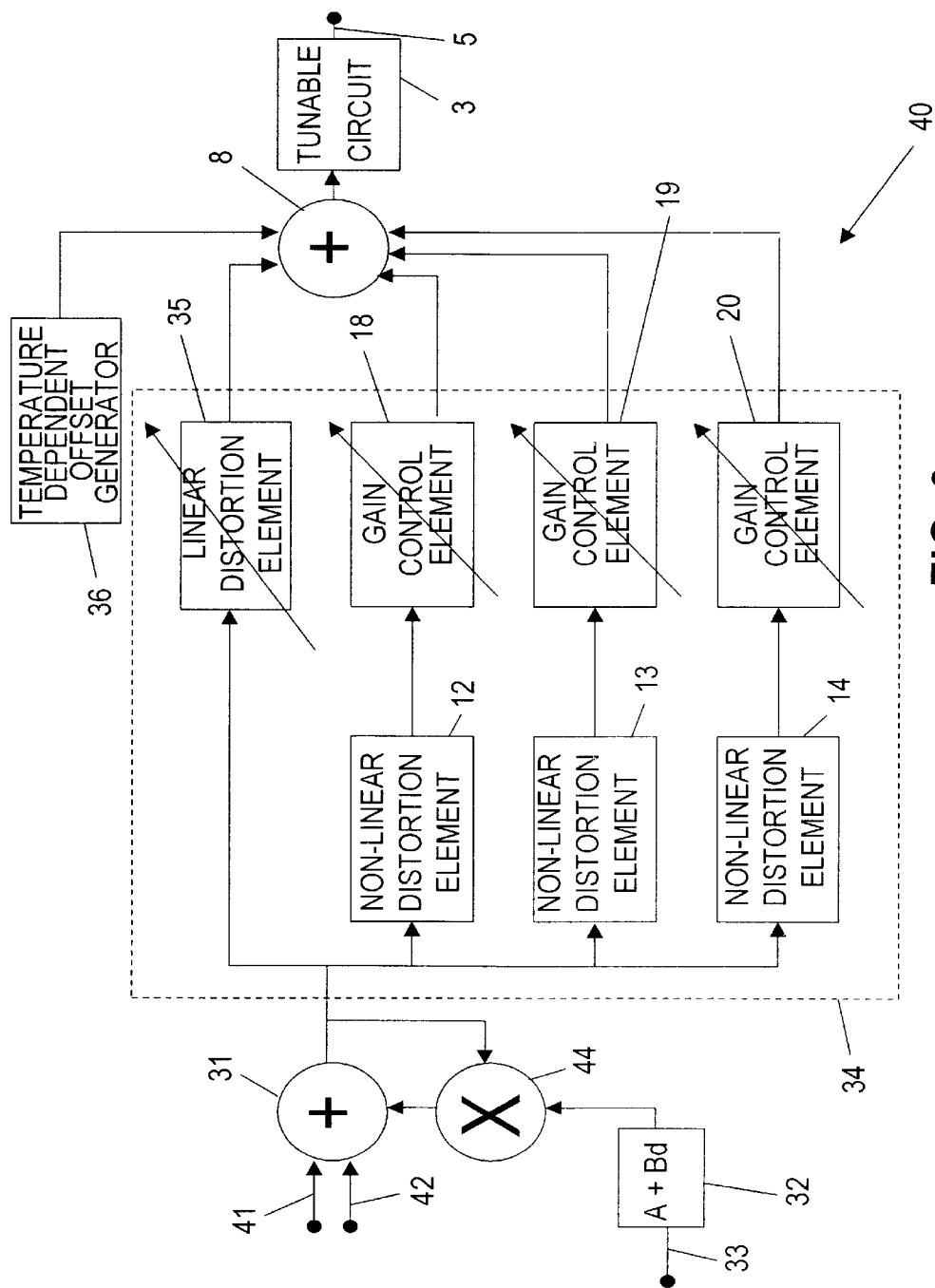
FIG. 3 shows a schematic circuit diagram of a tunable circuit system according to a third embodiment of the present invention.

FIG. 3 shows a third embodiment of a tunable circuit system 40, similar to that of FIG. 2, and where the same elements as in the second embodiment of FIG. 2 are shown with the same reference numerals. This embodiment is a modification of the second embodiment of FIG. 2, which can be used when the temperature dependent signal $S_\theta$ from a variable temperature function generator 32 is relatively small. In this case, the temperature dependent signal $S_\theta$ is coupled to a multiplier 44, which also receives an input from an output of an adder 43. It is useful in the context of crystal oscillators where such an adder already exists and is used to add a compensation signal from input terminal 41 and a frequency adjustment signal from input terminal 42 to provide the frequency control input signal $I_{FC}$. In this case, the output from the adder is provided to the predistortion circuit 34, as before, but is also fedback to the multiplier 44, where it is multiplied by the temperature dependent signal $S_\theta$ from the variable temperature function generator 32 and the product is added to the compensation signal and the frequency adjustment signal.

Figure 4:
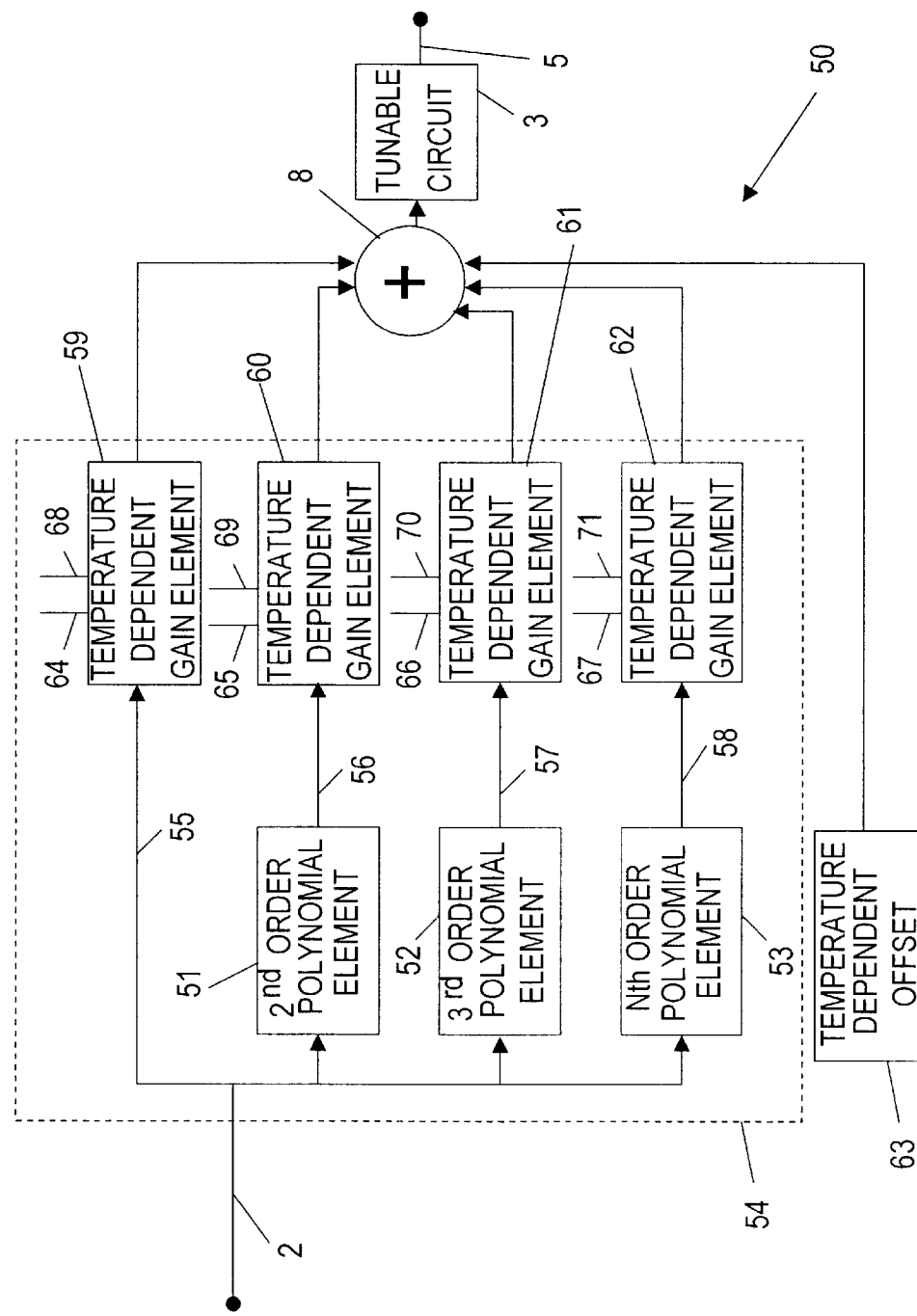
FIG. 4 shows a schematic circuit diagram of a tunable circuit system according to a fourth embodiment of the present invention.

FIG. 4 illustrates a fourth embodiment of a tunable circuit system 50. In this embodiment, the frequency control input signal $I_{FC}$ from input terminal 2 is coupled directly to a predistortion circuit 54, where the frequency control input signal $I_{FC}$ is passed to a set of N−1 polynomial elements of different orders, including a $2^{nd}$ order polynomial element 51, a $3^{rd}$ order polynomial element 52, up to an $N^{th}$ order polynomial element 53. A first order polynomial element is, of course, linear and therefore a path 55 for the first order polynomial is shown coupled directly to a temperature dependent gain element 59. Outputs 56, 57 and 58, respectively of the $2^{nd}$ order polynomial element 51, $3_{rd}$ order polynomial element 52, and $N^{th}$ order polynomial element 53 are also coupled to respective temperature dependent gain elements 60, 61 and 62. The temperature dependent gain elements 59, 60, 61 and 62 adjust the linear and $2_{nd}$ $3^{rd}$ and $N^{th}$ order polynomial functions of the frequency control input signal $I_{FC}$ as will be more fully described below, and their respective outputs are passed to the combining circuit element 8, where they are combined with a temperature dependent voltage, from a temperature dependent offset voltage generator 63, to provide the control signal for the tunable circuit 3. Each of the temperature dependent gain elements 59, 60, 61 and 62 has a temperature input 64, 65, 66 and 67, respectively, for receiving a temperature signal, and a gain control input 68, 69, 70 and 71, respectively, for receiving a gain control signal, which may be a digital signal.

Figure 5:
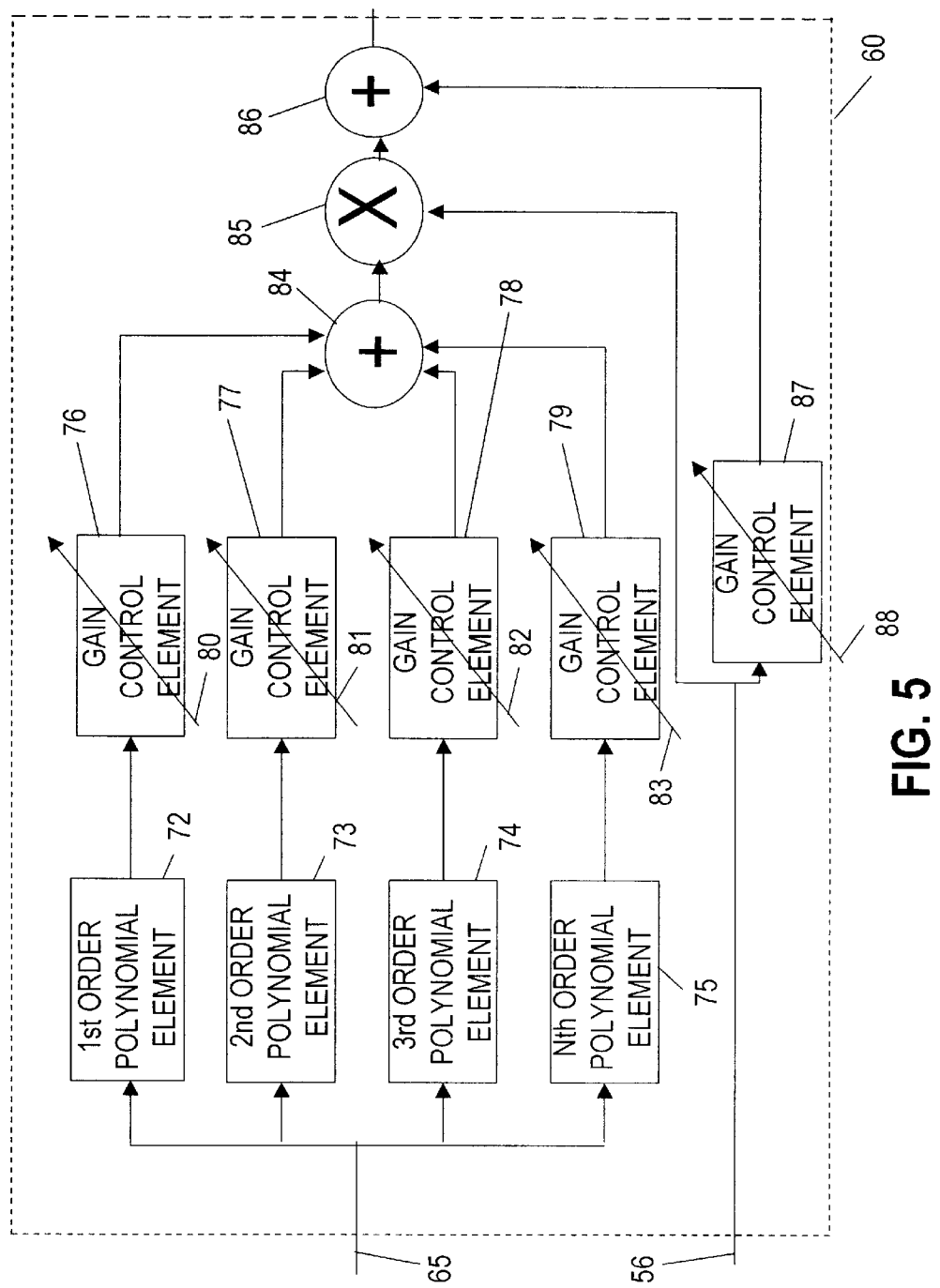
FIG. 5 shows a schematic circuit diagram of a temperature dependent gain control block used in the embodiment of FIG. 4.

One such temperature dependent gain element 60 is shown in FIG. 5, where the temperature input 65 is indicated as being coupled to each of four temperature polynomial function generators 72, 73, 74 and 75, which have their respective outputs coupled to respective digitally controlled gain elements 76, 77, 78 and 79. The temperature polynomial function generators 72, 73, 74 and 75 are preferably Chebyshev-like function generators, which produce functions of different orders. Thus, for example, temperature polynomial function generator 72 produces a $1^{st}$ order polynomial function result based on the temperature input, temperature polynomial function generator 73 produces a $2^{nd}$ order polynomial function result, temperature polynomial function generator 74 produces a $3_{rd}$ order polynomial function result and temperature polynomial function generator 75 produces an $N^{th}$ order polynomial function result. It will be appreciated that there can be any desired number of the temperature polynomial function generators and corresponding digitally controlled gain elements.

The digitally controlled gain elements 76, 77, 78 and 79 each have a digital control input 80, 81, 82 and 83, respectively, for digitally controlling their gains, and outputs of the digitally controlled gain elements 76, 77, 78 and 79 are coupled to an adder element 84 where the weighted temperature polynomial function results are added together. An output from the adder 83 is coupled to a multiplier 85, which multiplies the output of the adder 83 by the output from the corresponding polynomial element, in this case the $2^{nd}$ order polynomial element 51. The output from the polynomial element 51 is also coupled, in the temperature dependent gain element 60, via a digitally controlled gain element 87, having a digital control input 88, to a second adder 86, where the gain signal from the digitally controlled gain element 87 is added to the output from multiplier 85. The output of the second adder 86 is then provided as the output of the temperature dependent gain element 60, which output is coupled to the combining circuit element 8 of FIG. 4, where it is combined with similar signals from the other temperature dependent gain elements.

Although not illustrated, in a modification of the above embodiments, the combining circuit element 8 can be a summing amplifier, whose output, apart from being coupled to the tunable circuit 3, is also coupled to a multiplier that multiplies the output of the combining circuit element 8 by a temperature dependent function, the output of the multiplier being coupled back to the combining circuit element 8 to be combined with the other signals in a feedback loop. This modification applies especially where the tunable circuit includes a variable capacitance diode as a tuning control element.

It will be appreciated that although several particular embodiments of the invention have been described in detail, various modifications and improvements can be made by a person skilled in the art without departing from the scope of the present invention.

Thus, in one embodiment, the invention may provide a method of generating a frequency control signal for a tunable circuit, the method comprising the steps of receiving a frequency control input signal, generating a distorted signal from the frequency control input signal, providing a non-distorted version of the frequency control input signal, and combining the distorted signal with the non-distorted version of the frequency control input signal to provide a predistorted frequency control output signal.

The step of providing a non-distorted version of the frequency control input signal can comprise generating at least one linear component of the frequency control input signal and weighting the at least one linear component. The step of generating the linear component can comprise multiplying the frequency control input signal by at least one constant. The step of generating a distorted signal can comprise generating at least one non-linear component of the frequency control input signal.

If required, the step of generating the non-linear component can comprise applying at least a power law function to the frequency control input signal, which may be a square power law, a cubic power law, a Taylor series function, or a Chebyshev-like function. Alternatively or additionally, the step of generating the non-linear component can comprise applying at least an exponential function, or a logarithmic function, to the frequency control input signal.

In some cases, the method of generating a frequency control signal for a tunable circuit can further comprise the step of compensating the frequency control input signal for temperature. Alternatively, the predistorted frequency control output signal may be compensated for temperature.

In another embodiment, the invention may provide apparatus for generating a frequency control signal for a tunable circuit, the apparatus comprising an input terminal for receiving a frequency control input signal, a distortion circuit element having an input coupled to the input terminal and an output for providing a distorted signal based on the frequency control input signal, and a combination circuit element having a first input coupled to the output of the distortion circuit element, a second input coupled to the input terminal and an output for providing a predistorted frequency control output signal generated from a combination of the distorted signal and a non-distorted version of the frequency control input signal.

A non-distortion circuit element can be coupled between the second input of the combination circuit element and the input terminal having an input coupled to the input terminal and an output coupled to the second input of the combination circuit element for providing at least one linear component of the frequency control input signal. The non-distortion circuit element can provide a weighted linear component at its output. The weighted linear component could be generated from the frequency control input signal by multiplying the frequency control input signal by at least one constant.

In one embodiment, the distortion circuit element can comprise means for generating at least one non-linear component of the frequency control input signal. The distortion circuit element can comprise at least one analogue multiplier, for example a Gilbert cell. If required, the distortion circuit element can comprise means for programming correction coefficients for each of the non-linear components of the frequency control input signal.

In one embodiment, the distortion circuit element can comprise means for applying at least a power law function to the frequency control input signal. The power law function may be a square power law, a cubic power law, a Taylor series function, or a Chebyshev-like function. Alternatively, the distortion circuit element can comprise means for applying at least an exponential function, or a logarithmic function, to the frequency control input signal.

The distortion circuit element can comprise a processor, and can provide a weighed non-linear component at its output. The weighted non-linear component can be generated by multiplying the non-linear component by at least one constant.

The distortion circuit element may comprise at least one weighting input for receiving a weighting signal. The weighting input may be a digital input and may be coupled to a feedback control circuit to adjust the weighting signal according to the predistorted frequency control output signal.

In some cases, the apparatus for generating a frequency control signal for a tunable circuit, can further comprise a temperature compensation circuit element having an input coupled to the output of the combination circuit element and an output for providing a temperature compensated predistorted frequency control output signal.

Alternatively, the apparatus for generating a frequency control signal for a tunable circuit can further comprise a temperature compensation circuit element having an input coupled to the input terminal and an output coupled to the combination circuit element for providing a temperature compensated frequency control input signal to the combination circuit element.

In an alternative embodiment, the apparatus for generating a frequency control signal for a tunable circuit can further comprise a temperature compensation circuit element having an input coupled to the input terminal and an output coupled to the non-distortion circuit element for providing a temperature compensated frequency control input signal to the non-distortion circuit element.

In another embodiment, the invention may provide a tunable circuit system comprising a tunable circuit having an input coupled the output of the combination circuit element of an apparatus for generating a frequency control signal for a tunable circuit as described above. The tunable circuit may be an oscillator circuit or a filter circuit.

There may be provided, according to an embodiment of the present invention, a method and apparatus for generating a control signal, wherein some of the summed components are the product of a signal dependent only on the input signal, and a signal dependent only on the temperature, wherein one or both of the signal transfer functions may optionally be adjustable, such adjustment being derived from analogue or digital control signals. Furthermore, the adjustment of at least some of the terms may be restricted to varying of the gain of those terms.

It can thus be seen that the preferred embodiments solve the problem of non-linearity in the tuning of an oscillator circuit by providing a non-linear modification to the original control signal. This non-linearity is arranged so that the tuning effect of the original signal follows the desired law. In an exemplary implementation, the modification is effected by adding second-order and third order input signal dependent components to the signal seen at the oscillator control input. Temperature dependence is controlled by providing a linearly temperature dependent component to the overall gain from the initial control signal to the oscillator control input. The temperature dependence can be made non-linear, if desired, and the signal non-linearity can use components of any desired order. The oscillator control signal can also incorporate a simply temperature dependent offset. This is useful in variable capacitance diode (Varactor or Varicap) tuned oscillators, for example, where the non-linearity of the voltage tuning characteristic often appears to be similar at all temperatures, apart form a shift in the reference voltage.

A possible enhancement to the above scheme is to make all the above non-linear adjustments digitally set. They can then be measured on the completed oscillator, and corrected, thereby alleviating the issues of component and mechanical tolerancing.

A typical integrated voltage controlled crystal oscillator circuit uses a Colpitts type of oscillator and gives a frequency pulling law of the type:

Frequency Shift=constant/$\{1/([0.8+V_{control}]^{\wedge}0.5/C_{varicap}+1/C_{oscillator})+C_0\}$ for a frequency shift is above crystal series resonance, where:

$V_{control}$ is the voltage applied across the frequency controlling Varicap;

$C_{varicap}$ is the effective capacitance of the Varicap at 0 Volts bias;

$C_{oscillator}$ is the effective operating series capacitance of the remaining components of the oscillator;

$C_0$ is the effective parallel capacitance (or "static capacitance") of the crystal resonator, including relevant parasitic capacitances.

By way of example, a crystal oscillator with the following parameters:

$V_{control}$ varied between 0 Volts and 4.5 Volts;

$C_{varicap}$=20 pF;

$C_{osillator}$=20 pF; and $C_0$=3 pF was analysed and it was found that, uncorrected, the pulling slope will vary by +/− 56% relative to its median value, and the frequency departure from the best-fit straight line will be +/−7.5% of the total pulling range. On the other hand, if just second-order correction is applied, the errors reduce to 6% and 0.7% respectively, whereas if third-order correction is applied, these errors are reduced still further to 1% and 0.03%.

According to still further aspects, there is provided a method of generating a control signal for a tunable circuit, the method comprising the steps of receiving an input control signal, generating a first signal having a non-linear dependence on the input control signal, and providing a control signal based on the first signal at an output terminal for coupling to a tunable circuit.

Preferably, the method further comprises the step of generating a second signal having a linear dependence on the input control signal and wherein the step of providing a control signal comprises combining the first and second signals to provide the control signal. The step of generating a first signal is preferably temperature dependent. In one preferred embodiment, the step of generating a first signal comprises generating a plurality of non-linear signals and wherein the plurality of non-linear signals are combined to produce the control signal. At least one of the non-linear signals is preferably substantially polynomial in form, for example resembling a Chebyshev function. The input control signal is preferably a weighted sum of two or more separately derived input signals, where the weighting of the separately derived input signals is adjustable by separate controlling signals. The separately derived input signals may include a temperature compensation signal and/or an externally applied frequency adjustment signal. Preferably, the method further comprises the step of generating a final gain signal and applying the final gain signal to the control signal at the output terminal.

In another aspect, there is provided an apparatus for generating a control signal for a tunable circuit, the apparatus comprising an input terminal for receiving an input control signal, a distortion circuit element having an input coupled to the input terminal and an output for providing a first signal having a non-linear dependence on the input control signal, and an output terminal for providing a predistorted control signal for controlling the tunable circuit.

In one embodiment, the apparatus preferably further comprises a non-distortion circuit element having an input coupled to the input terminal and an output for providing a second signal having a linear dependence on the input control signal, and a combination circuit element having a first input coupled to the output of the distortion circuit element, a second input coupled to the output of the non-distortion circuit element and an output coupled to the output terminal, wherein the predistorted control signal is a combination of the first and second signals.

The apparatus preferably further comprises a temperature function generating element having an input for receiving a temperature indicating signal and an output for providing a temperature dependent signal, and a combination element having a first input coupled to the first terminal, a second input coupled to the output of the temperature function generating element and an output coupled to the input of the distortion circuit element for providing a temperature dependent input control signal thereto. The distortion circuit element preferably comprises a plurality of means for generating a plurality of signals having a non-linear dependence on the input control signal. At least one of the means for generating a plurality of signals having a non-linear dependence on the input control signal can be an analogue multiplier, such as a Gilbert cell.

In one preferred embodiment, the distortion circuit element further comprises at least one gain control element, which preferably has a digital control input.

A further aspect provides a tunable circuit system comprising a tunable circuit having an input coupled the output of the combination circuit element of an apparatus for generating a control signal for a tunable circuit as described above. The tunable circuit may be an oscillator circuit or a filter circuit.

What is claimed is:

1. A method of generating a control signal for a parameter sensitive circuit, the method comprising the steps of:
    receiving a first input control signal;
    receiving a second input signal determined by a parameter to which the circuit is sensitive;
    generating a third intermediate signal from the first and second input signals;
    generating at least a fourth intermediate signal having a non-linear dependence on at least one of the first and third signals; and
    generating an output control signal for the parameter sensitive circuit, by combining at predetermined levels at least the fourth intermediate signal and one of the first, second and third signals such that the output control signal is dependent on both the first and second input signals, whose sensitivity to changes in one of the input signals is dependent on the level of the other input signal.

2. A method according to claim 1, wherein at least the fourth intermediate signal comprises a polynomial function of at least one of the first and third signals.

3. A method according to claim 1, wherein the third signal comprises the sum of a constant, a constant multiple of the first input signal, and a constant multiple of the product of the first and the second input signals.

4. A method according to claim 1, wherein neither of the first and second signals can be determined solely from the other.

5. A method according to claim 1, wherein the first input signal is dependent on the same parameter as the second input signal.

6. A method according to claim 1, wherein the output control signal comprises the sum of signals that are polynomial functions of the third signal.

7. A method according to claim 1, wherein the output control signal comprises the sum of a temperature-dependent signal and of signals that are polynomial functions of the third signal.

8. A method according to claim 1, further comprising the step of providing at least one predetermined gain control signal for controlling the gain of any of the signals utilised to generate the output control signal.

9. A method according to claim 1, wherein the second input signal is dependent solely on temperature.

10. A circuit for generating a control signal according to the method of claim 1.

11. A circuit according to claim 10, wherein at least the fourth intermediate signal comprises a polynomial function of at least one of the first and third signals.

12. A circuit according to claim 10, wherein the third signal comprises the sum of a constant, a constant multiple of the first input signal, and a constant multiple of the product of the first and the second input signals.

13. A circuit according to claim 10, wherein the output control signal comprises the sum of signals that are polynomial functions of the third signal.

14. A circuit according to claim 10, wherein the output control signal comprises the sum of a temperature-dependent signal and of signals that are polynomial functions of the third signal.

15. A circuit according to claim 10, further comprising at least one gain control element for controlling the gain of any of the signals utilised to generate the output control signal.

16. A circuit according to claim 10, wherein the second input signal is dependent solely on temperature.

17. Apparatus comprising a parameter sensitive circuit and a circuit according to claim 10.

18. Apparatus according to claim 17, wherein the parameter sensitive circuit comprises a tunable circuit and the output control signal of the circuit compensates for parameter sensitive variations of tuning components that are used to tune the tunable circuit.

19. Apparatus according to claim 18, wherein the output control signal of the circuit comprises the sum of signals that are polynomial functions of the third signal.

20. Apparatus according to claim 19, wherein said circuit further comprises at least one gain control element for controlling the gain of any of the signals utilised to generate the output control signal so as to compensate for non-linear tuning of the tunable circuit.

21. Apparatus according to claim 20, wherein the output control signal further comprises a signal that is dependent solely on temperature, said signal being suitable for compensating for variations of built-in potential of the tuning components.

22. Apparatus according to claim 17, wherein the second input signal is dependent solely on temperature, and is suitable for compensating for residual temperature dependence of the tuning sensitivity of the tunable circuit.

23. Apparatus according to claim 17, wherein the first input signal includes a temperature dependent component suitable for compensating for a temperature dependence of a nominal resonance frequency of the tunable circuit.

24. Apparatus according to claim 17, wherein the first input signal is generated as a sum of a signal that is dependent only on temperature, and another signal that is independent of temperature, the first input signal being suitable for setting a nominal resonance frequency of the tunable circuit to a frequency that is dependent on this temperature-independent signal, and with a predetermined temperature dependence.

25. Apparatus according to claim 17, wherein at least one component of the tunable circuit is oscillatory.

26. Apparatus according to claim 17, wherein the tunable circuit incorporates at least an electro-acoustic resonator.

* * * * *

UNITED STATES PATENT AND TRADEMARK OFFICE
CERTIFICATE OF CORRECTION

PATENT NO.    : 6,549,055 B2
DATED         : April 15, 2003
INVENTOR(S)   : George Hedley Storm Rokos It is certified that error appears in the above-identified patent and that said Letters Patent is hereby corrected as shown below:

Drawings,
Fig. 2, delete the caption for element 33, "d," and insert in its place -- $\theta$ --.
Fig. 2, delete the caption for element 32, "A+Bd," and insert in its place -- A+B$\theta$ --.
Fig. 3, delete the caption for element 32, "A+Bd," and insert in its place -- A+B$\theta$ --.

Signed and Sealed this

Twenty-sixth Day of August, 2003

JAMES E. ROGAN
*Director of the United States Patent and Trademark Office*